US008854036B2

(12) United States Patent
Nakajima et al.

(10) Patent No.: US 8,854,036 B2
(45) Date of Patent: Oct. 7, 2014

(54) CURRENT DETECTING APPARATUS

(71) Applicant: Sumitomo Wiring Systems, Ltd., Yokkaichi (JP)

(72) Inventors: Hirokatsu Nakajima, Yokkaichi (JP); Satoru Chaen, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 28 days.

(21) Appl. No.: 13/655,503

(22) Filed: Oct. 19, 2012

(65) Prior Publication Data
US 2013/0162246 A1 Jun. 27, 2013

(30) Foreign Application Priority Data

Dec. 22, 2011 (JP) ................. 2011-281436

(51) Int. Cl.
*G01R 33/09* (2006.01)
*G01R 15/20* (2006.01)
(52) U.S. Cl.
CPC .............. *G01R 33/09* (2013.01); *G01R 15/202* (2013.01); *G01R 15/207* (2013.01)
USPC ................... 324/252; 324/117 H; 324/117 R; 324/156
(58) Field of Classification Search
None
See application file for complete search history.

(56) References Cited

U.S. PATENT DOCUMENTS 4,972,140 A 11/1990 Okazaki et al.

FOREIGN PATENT DOCUMENTS

| JP | 07086769 A | * | 3/1995 |
| JP | 07260829 A | * | 10/1995 |
| JP | A-2004-101384 |  | 4/2004 |

OTHER PUBLICATIONS

Machine English translation of Japanese Patent Application Publication to Inventor S Kajiya et. al. JP 1995-086769 A, Mar. 31, 1995. Translation of pp. 2-5 created on Feb. 21, 2014.*
Machine English translation of Japanese Patent Application Publication to Inventor Minoru Noda. JP 1995-260829 A, Oct. 13, 1995. Translation of pp. 2-4 created on Feb. 11, 2014.*
Feb. 27, 2014 Non-Final Rejection issued in U.S. Appl. No. 13/647,946.

* cited by examiner

*Primary Examiner* — Melissa Koval
*Assistant Examiner* — Stephen G Armstrong
(74) *Attorney, Agent, or Firm* — Oliff PLC

(57) ABSTRACT

In a current detecting apparatus, a container member includes a substrate fixing portion, a core inner-edge positioning portions, and a lid member. The substrate fixing portion is a portion formed at a position outside an outer edge of a magnetic core, and to which a first portion of a circuit board is fixed. Two of the core inner-edge positioning portions come into contact with the magnetic core, and come into contact with the circuit board. The first portion, the second portion, and the third portion surround a magnetoelectric device, such as a Hall element, that detects a magnetic flux in a gap portion of the magnetic core. The lid-side substrate holding portion, with the container-side substrate holding portion, holds the circuit board tightly.

9 Claims, 7 Drawing Sheets

CURRENT DETECTING APPARATUS

This application claims priority to JP2011-281436 filed Dec. 22, 2011.

The application relates to a current detecting apparatus configured to detect electric current flowing through a transmission channel such as a bus bar.

BACKGROUND

Vehicles such as hybrid automobiles or electric vehicles sometimes include a current detecting apparatus configured to detect electric current flowing through a bus bar connected to a battery mounted thereon. Examples of such a current detecting apparatus which may be employed include a current detecting apparatus of a magnetic proportion system or a current detecting apparatus of a magnetic balance system.

The current detecting apparatus of the magnetic proportion system or of the magnetic balance system includes, as described in JP2004-A-101384, for example, a magnetic core and a magnetoelectric device (magnetic induction device). The magnetic core is a substantially ring-shaped magnetic body having ends facing each other via a gap portion therebetween and formed continuously so as to surround the periphery of a hollow portion where the bus bar penetrates. The hollow portion of the magnetic body is a space where the detected current passes through.

The magnetoelectric device is a device configured to be arranged at the gap portion of the magnetic core, detect a magnetic flux which varies with a current flowing through the transmission channel such as the bus bar arranged through the hollow portion, and output a detection signal of the magnetic flux as an electric signal. A Hall element is generally employed as the magnetoelectric device.

As described in JP-A-2004-101384, in the current detecting apparatus, the magnetic core and the magnetoelectric device are held at a certain positional relationship by a housing having insulating properties in many cases. The housing sets up the positioning of a plurality of components which constitute the current detecting apparatus to a certain positional relationship. The housing is generally formed of a resin member having insulating properties.

As described in JP-A-2004-101384, a magnetism detecting portion of the magnetoelectric device is arranged at the gap portion of the magnetic core, and a lead terminal extending from the magnetism detecting portion is secured to a circuit board by soldering together with the lead terminal of a connector connected to a cable with a connector for transmitting a signal and other electronic components. The circuit board thereof is fixed to screw seats provided on parts of the housing with screws.

For example, in the example described in JP-A-2004-101384, a body portion of the connector is formed as part of the housing, and the lead terminal of the connector is secured to the circuit board to be mounted in the housing. The lead terminal of the magnetoelectric device is secured to the circuit board in advance.

SUMMARY

Incidentally, since the current detecting apparatuses to be mounted on the vehicles are used in an environment having a wide temperature range, the circuit board is susceptible to a deflection due to a change in environmental temperature. The deflection (warp) of the circuit board may cause a displacement of a positional relationship between the magnetoelectric device and the magnetic core mounted on the circuit board and hence may cause deterioration of current detection accuracy.

Also, as described in JP-A-2004-101384, when the body portion of the connector is formed as part of the housing of the current detecting apparatus, and the lead terminal of the connector is assembled to the housing, it is difficult to attach the elongated magnetic lead terminals to each housing with high degree of positional accuracy in a process of assembling the current detecting apparatuses.

Therefore, in terms of cost and easiness of manufacture, it is preferable that a general-purpose connector including the body portion and the lead terminal integrated with high degree of dimensional accuracy in advance (commercially available connector) is employed, and such a general-purpose connector is mounted on the circuit board.

When the general-purpose connector independent from the housing is mounted and fixed to the circuit board, the circuit board is susceptible to a deflection because the circuit board is formed to be relatively large and a force is applied to the circuit board via the connector at the time of connection and disconnection of the cable with a connector with respect to the connector. Therefore, when the general-purpose connector is mounted on the circuit board, deterioration of the current detection accuracy due to the displacement of the positional relationship between the magnetoelectric device and the magnetic core becomes apparent.

However, in JP-A-2004-101384, there is no description about a detailed structure for reducing the deflection of the circuit board on which the magnetoelectric device is mounted in the current detecting apparatus.

Exemplary embodiments provide a current detecting apparatus in which deterioration of the current detection accuracy caused by a displacement of a positional relationship between a magnetoelectric device and a magnetic core mounted on the circuit board is reduced.

A current detecting apparatus according to exemplary embodiments includes a magnetic core, a circuit board, and a housing. The magnetic core is a member formed of a magnetic material, having both ends facing each other via a gap portion interposed therebetween, and formed continuously so as to surround the periphery of a hollow portion. The circuit board is a substrate on which a magnetoelectric device configured to detect a magnetic flux in the gap portion of the magnetic core is mounted in an upright position. The housing is a member including a container member and a lid member each having insulating properties and being combined with one another, and is configured to accommodate the magnetic core and the circuit board and to support the magnetic core and the circuit board in a certain positional relationship. Then, the housing includes a substrate fixing portion, a container-side substrate holding portion, and a lid-side substrate holding portion described below. The substrate fixing portion is a portion formed in the container member at a position outside an outer edge of the magnetic core supported by the container member, and to which a first portion of the circuit board is fixed. The container-side substrate holding portion is a portion formed in the container member so as to project therefrom, penetrating through the hollow portion of the magnetic core supported by the container member, and having a top portion coming into contact with first surfaces of a second portion and a third portion which surround a portion of the circuit board where the magnetoelectric device is mounted from three sides in cooperation with the first portion. The lid-side substrate holding portion is a lid-side substrate holding portion formed so as to project from the lid member, and having a top portion coming into contact at least with second surfaces of the second portion and the third portion of the circuit board, and configured to hold the circuit board tightly with the container-side substrate holding portion.

In the current detecting apparatus the housing may include an element positioning portion, a core outer-edge positioning portion, and a core inner-edge positioning portion described below. The element positioning portion is a portion formed in the container member so as to project therefrom, forming a space which allows fitting of a magnetism detecting portion of the magnetoelectric device at a position of the gap portion of the magnetic core, and coming into contact respectively to both end surfaces of the magnetic core. The core outer-edge positioning portion is a portion formed in the container member so as to project therefrom, and coming into contact with side portions of the gap portion on an outer edge of the magnetic core at side surfaces thereof. The core inner-edge positioning portion is a portion formed in the container member so as to project therefrom, coming into contact with the side portions of the gap portion on an inner edge of the magnetic core at the side surfaces thereof, and holding the magnetic core tightly with the core outer-edge positioning portion. Then, the core inner-edge positioning portion serves also as the container-side substrate holding portion.

In the current detecting apparatus the housing may further include a substrate rotation restricting portion formed on the container member and configured to restrict the rotation of the circuit board about the first portion in contact with an edge portion of the circuit board.

The current detecting apparatus may further include a connector fixed to the circuit board and electrically connected to the magnetoelectric device.

The housing may further include a connector positioning portion formed on the container member and configured to hold the position of the connector in dimensions of three directions.

In the current detecting apparatus according to exemplary embodiments, the circuit board on which the magnetoelectric device is mounted is fixed to the substrate fixing portion of the housing at the first portion, and is held tightly between the container-side substrate holding portion and the lid-side substrate holding portion of the housing at the second portion and the third portion. Therefore, the first portion, the second portion, and the third portion of the circuit board can be set within a very small range, so that the area surrounded by the three portions of the circuit board is hardly deflected. Hereinafter, the area surrounded by the first to third portions of the circuit board is referred to as a "surrounded area".

Since the magnetoelectric device is mounted in the surrounded area on the circuit board, the displacement of the magnetoelectric device caused by the deflection (warp) of the circuit board hardly occurs. Therefore, according to exemplary embodiments, deterioration of the current detection accuracy caused by a displacement of a positional relationship between a magnetoelectric device and a magnetic core mounted on the circuit board may be reduced.

In exemplary embodiments, the element positioning portion may be configured to restrict the positional displacement of the magnetism detecting portion of the magnetoelectric device also has a function to restrict the positional displacement of the both end surfaces of the magnetic core. In addition, the core inner-edge positioning portion configured to restrict the positioning displacement of the magnetic core toward the inner edge also serves as the container-side substrate holding portion. Furthermore, the element positioning portion, the core outer-edge positioning portion, and the core inner-edge positioning portion which serves also as the container-side substrate holding portion exist intensively within the very small range around the magnetoelectric device.

Thus, positioning of the magnetic core, the mounting portion of the magnetoelectric device of the circuit board, and the magnetism detecting portion of the magnetoelectric device can be achieved by a small number of positioning portions existing intensively within the very small range in the housing. Therefore, the magnetoelectric device and the magnetic core are not susceptible to the displacement of the positional relationship caused by dimension errors of the respective positioning portions in the housing, so that the positioning with high degree of accuracy is achieved. Consequently, deterioration of the current detection accuracy is reduced more reliably.

In exemplary embodiments, the substrate rotation restricting portion restricts the circuit board, fixed at one point by the substrate fixing portion, from rotating. Consequently, the positional displacement of the magnetoelectric device and the deterioration of the current detection accuracy caused by the rotation of the circuit board are also reduced. In comparison with a case where the circuit board is fixed at a plurality of points by fastening screws or the like, the number of steps of fixing work of the circuit board is reduced.

According to exemplary embodiments, since the connector is fixed to the circuit board, the effects described above become more apparent when the circuit board is susceptible to an external force via the connector.

In exemplary embodiments, positioning of the connector fixed to the circuit board is achieved by the housing. Therefore, the external force applied to the connector dispersedly acts on the connector positioning portion of the housing and the circuit board, and the influence of the external force applied to the connector on the positional displacement of the circuit board and the magnetoelectric device is alleviated. Consequently, the positional displacement of the magnetoelectric device and the deterioration of the current detection accuracy caused by the external force applied to the connector are reduced more reliably.

DETAILED DESCRIPTION OF THE EMBODIMENTS

Figure 1:
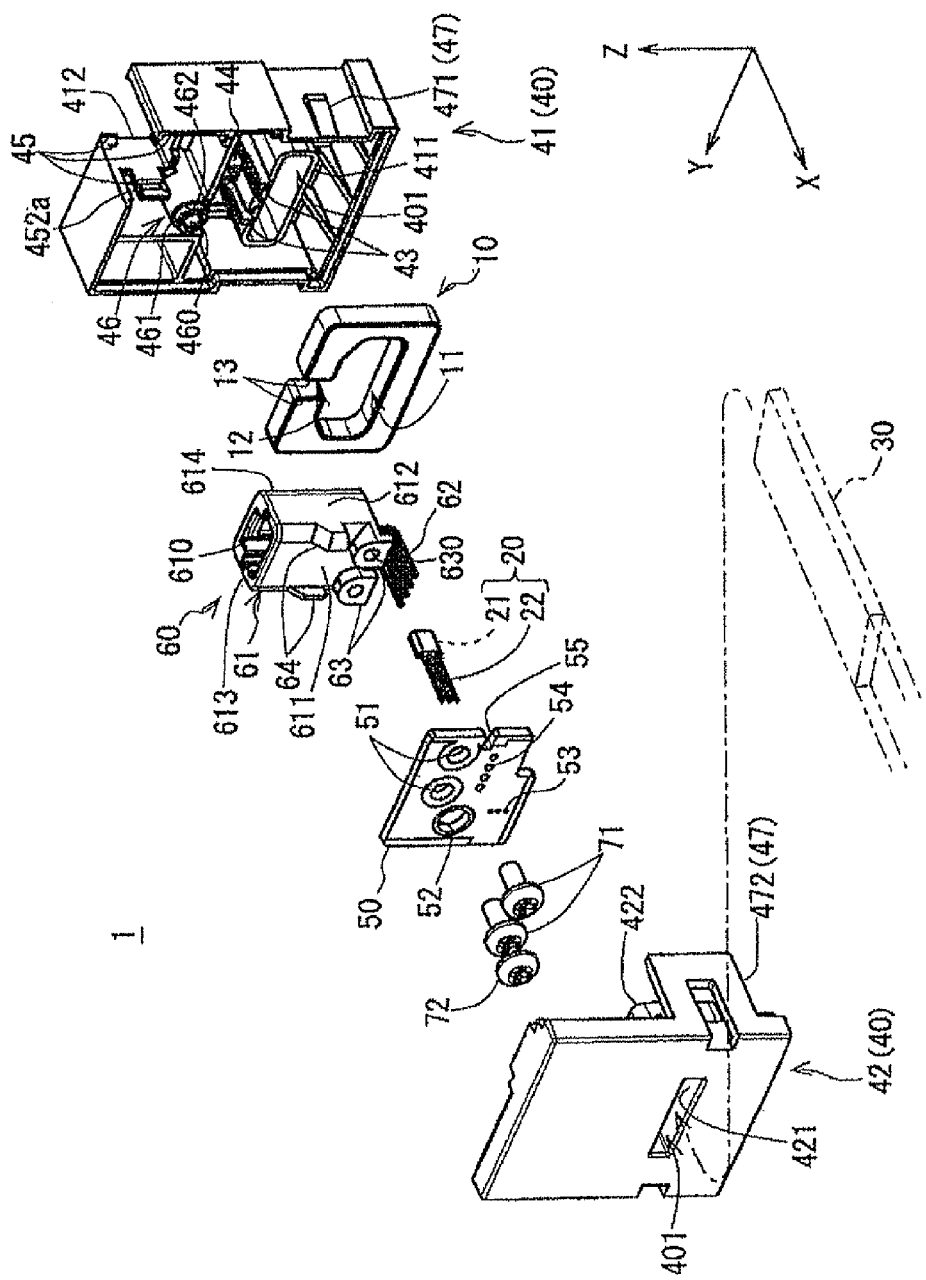
FIG. 1 is an exploded side view of a current detecting apparatus 1 according to an exemplary embodiment.

Referring now to the drawings, exemplary embodiments will be described. The embodiments described below are provided only as examples, and are not intended for limiting the technical scope of the application.

Figure 2:
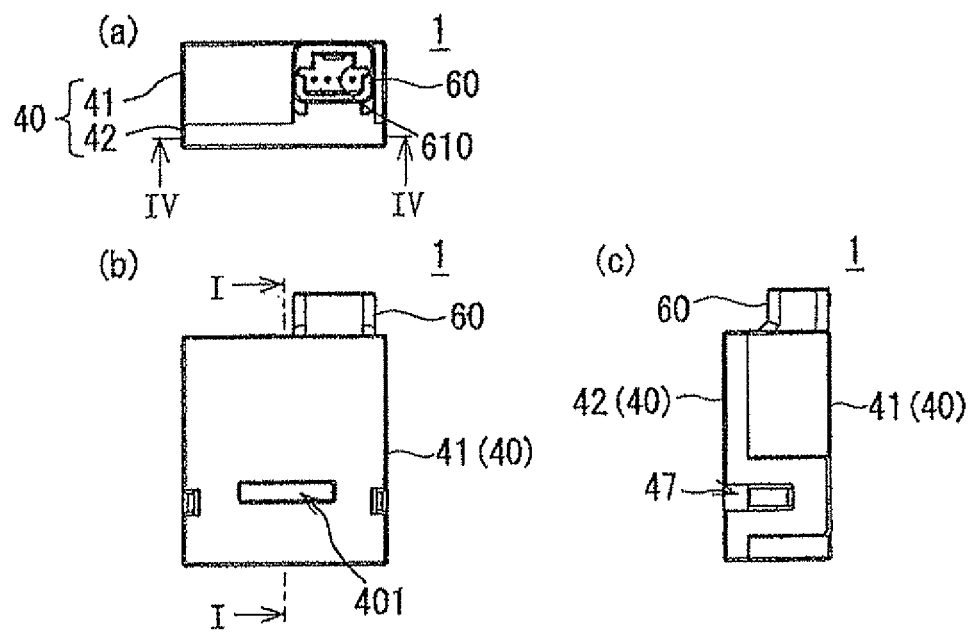
FIG. 2 shows three side views of the current detecting apparatus 1.
Figure 3:
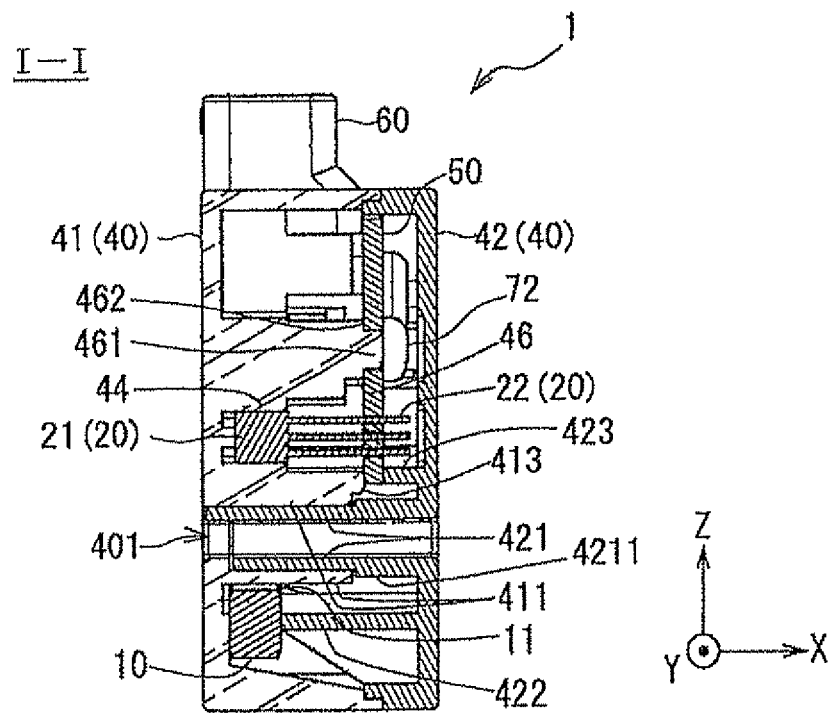
FIG. 3 is a vertical cross-sectional view of the current detecting apparatus 1.

Referring first to FIG. 1 to FIG. 3, a schematic configuration of a current detecting apparatus 1 according to exemplary embodiments will be described. The current detecting apparatus 1 is an apparatus configured to detect electric current flowing through a bus bar which electrically connects a battery and equipment such as a motor in vehicles such as electric vehicles or hybrid automobiles. As illustrated in FIG. 1, the current detecting apparatus 1 includes a magnetic core 10, a Hall element 20, an insulating housing 40, a circuit board 50, a connector 60, first screws 71, and a second screw 72.

As illustrated in FIG. 1 and FIG. 2, the insulating housing 40 includes a container member 41 and a lid member 42 configured to be assembled to each other. The circuit board 50 is a substrate on which the Hall element 20 and the connector 60 are mounted.

In the description given below, a direction in which the container member 41 and the lid member 42 which constitute the insulating housing 40 are assembled, that is, a direction in which the container member 41 and the lid member 42 face is referred to as a first direction. A direction of the width of the insulating housing 40 orthogonal to the first direction is referred to as a second direction. A direction of height of the insulating housing 40 orthogonal to the first direction and the second direction is referred to as a third direction. In coordinate axes illustrated in the respective drawings, an X-axis direction indicates the first direction, a Y-axis direction indicates the second direction, and a Z-axis direction indicates the third direction.

FIG. 2(a) is a plan view of the current detecting apparatus 1, FIG. 2(b) is a front view of the current detecting apparatus 1, and FIG. 2(c) is a side view of the current detecting apparatus 1. FIG. 3 is a cross-sectional view of the current detecting apparatus 1 in a I-I plane illustrated in FIG. 2(b).

The magnetic core 10 is a member formed of a magnetic material such as ferrite or silicon steel. The magnetic core 10 has a shape having both end surfaces 13 facing each other via a gap portion 12 of approximately several millimeters therebetween and formed continuously so as to surround the periphery of a hollow portion 11. In other words, the magnetic core 10 including the narrow gap portion 12 is formed into a ring shape.

In exemplary embodiments, the magnetic core 10 including the gap portion 12 is formed into a substantially rectangular ring shape surrounding the hollow portion 11 of a rectangular shape with rounded corners. There is also a case where the magnetic core 10 including the gap portion 12 is formed into a circular ring shape surrounding the circular hollow portion 11.

A transmission channel 30 such as a bus bar through which electric current to be detected flows is arranged so as to penetrate through the hollow portion 11 of the magnetic core 10. In FIG. 1, the transmission channel 30 is illustrated by an imaginary line (double-dashed chain line).

The Hall element 20 is a sensor configured to detect a magnetic flux in the gap portion 12 of the magnetic core 10. In the exemplary embodiments, the Hall element 20 is an IC of a lead wire type including a magnetism detecting portion 21 as a main body portion of the element and a plurality of lead terminals 22 protruded from a bottom surface of the magnetism detecting portion 21. The plurality of lead terminals 22 include a terminal for inputting power and a terminal for outputting a detection signal. The plurality of lead terminals 22 are inserted into Hall element mounting holes 53 formed on the circuit board 50, and are secured to a wiring pattern of the circuit board 50 by soldering.

The magnetism detecting portion 21 of the Hall element 20 is arranged in the gap portion 12 of the magnetic core 10. In this state, the Hall element 20 detects a magnetic flux which varies with electric current passing through the hollow portion 11 of the magnetic core 10, and outputs the detection signal of the magnetic flux as the electric signal. The Hall element 20 is an example of the magnetoelectric device.

The Hall element 20 detects the magnetic flux passing through a detection center, which is a predetermined portion of the magnetism detecting portion 21 along a predetermined direction with the highest sensitivity. In general, a reference straight line indicating a route of the magnetic flux detected by the Hall element 20 with highest degree of sensitivity passes a substantially center of the magnetism detecting portion, and is a straight line orthogonal to front and back surfaces of the magnetism detecting portion 21.

In the current detecting apparatus 1, a state in which the detection center of the magnetism detecting portion 21 is located at a center point of the gap portion 12 of the magnetic core 10, and the reference straight line of the magnetism detecting portion 21 overlaps with a straight line connecting centers of projecting surfaces of the facing both end surfaces 13 of the magnetic core 10 is an ideal state of arrangement of the magnetism detecting portion 21.

The circuit board 50 is a printed circuit board on which a portion of the lead terminals 22 of the Hall element 20 is mounted. The circuit board 50 is provided with a lead terminal 62 of the connector 60 and a circuit configured to perform a stabilization process for the detection signal of the magnetic flux output from the Hall element 20. The lead terminal 62 is mounted on the circuit board 50 with the Hall element 20.

The circuit board 50 is formed with two first through holes 51 which allow penetration of two of the first screws 71 respectively and the one second through hole 52 which allows penetration of the one second screw 72. In the current detecting apparatus 1, the first screws 71 are screws for fixing a body portion 61 of the connector 60 to the circuit board 50. The second screw 72 is a screw for fixing the circuit board 50 to the container member 41 of the insulating housing 40.

The connector 60 is a component to which a counterpart connector provided on an electric cable, not shown, is connected. The connector 60 is provided with the body portion 61 and the lead terminal 62. The body portion 61 is a portion where a connecting port 610 to which the counterpart connector is connected is formed. The lead terminal 62 is a terminal having electrical conductivity configured to electrically connect a metallic terminal in the body portion 61 and a wiring pattern of the circuit board 50.

A plurality of the lead terminals 62 of the connector 60 are inserted into connector mounting holes 54 formed on the circuit board 50, and are secured to the wiring pattern of the circuit board 50 by soldering.

The connector 60 employed in exemplary embodiments is not a component specifically manufactured for the current detecting apparatus 1, but is a general-purpose connector which may be employed for other apparatuses. Therefore, the body portion 61 and the lead terminals 62 are integrated in advance with high degree of positional accuracy.

The circuit board 50 is provided with a circuit configured to electrically connect the lead terminals 22 of the Hall element 20 and the lead terminals 62 of the connector 60. For example, the circuit board 50 is provided with a circuit configured to supply power input from the outside via an electric wire and the connector 60 to the lead terminals 22 of the Hall element 20 and a circuit configured to perform the stabilization process with respect to a detection signal of the Hall element 20 and output the processed signal to the lead terminals 62 of the connector 60. Accordingly, the current detecting apparatus 1 is allowed to output a current detection signal to an external circuit of an electronic control unit or the like through the electric wire with a connector which is connected to the connector 60.

In the following description, a side surface out of four side surfaces of the body portion 61 of the connector 60 facing the circuit board 50 is referred to as a first side surface 611. The first side surface 611 is also a surface facing toward one side of the first direction (the positive side of the X-axis). Two side surfaces out of the four side surfaces of the body portion 61 of the connector 60 positioned on sides of the first side surface 611 are referred to as a second side surface 612 and a third side surface 613, respectively. The second side surface 612 and the third side surface 613 are also surfaces facing one side (the negative side of the Y-axis) and the other side (the positive side of the Y-axis) of the second direction. A side surface out of the four side surfaces of the body portion 61 of the connector 60 positioned opposite the first side surface 611 is referred to as a fourth side surface 614.

The body portion 61 of the connector 60 is formed with two screw seats 63 which are projecting portions formed respectively with screw holes 630 to allow the two first screws 71 to be screwed therein on top portions thereof and two column portions 64 which are projecting portions formed to have the same height as the screw seats 63.

More specifically, the two screw seats 63 project from edge portions which define boundaries of the first side surface 611 of the body portion 61 with respect to the second side surface 612 and the third side surface 613. In the same manner, the two column portions 64 also project from the edge portions which define boundaries of the first side surface 611 of the body portion 61 with respect to the second side surface 612 and the third side surface 613 at a distance respectively with respect to the two screw seats 63.

The body portion 61 of the connector 60 is fixed to the circuit board 50 at two positions with the two first screws 71 in a state in which the respective top portions of the two screw seats 63 and the two column portions 64 come into contact with the surface of the circuit board 50. Since the four projecting portions composed of the screw seats 63 and the column portions 64 having the same height come into contact with the surface of the circuit board 50, the body portion 61 of the connector 60 are fixed in a stable posture with respect to the circuit board 50.

The container member 41 and the lid member 42 which constitute the insulating housing 40 are respectively integral molded members formed of a resin material having insulating properties. The container member 41 and the lid member 42 are respectively the integral molded members formed of resin having insulating properties such as polyamide (PA), polypropylene (PP) or an ABS resin.

The container member 41 is formed into a box-shape having an opening and the lid member 42 closes the opening of the container member 41 by being assembled to the container member 41. The container member 41 and the lid member 42 are formed with a current pass hole 401 as a through hole which allows insertion of the transmission channel 30.

The container member 41 is formed with a cylindrical outer frame portion 411 surrounding the periphery of the current pass hole 401 on an inner surface thereof. In the same manner, the lid member 42 is formed with a cylindrical inner frame portion 421 surrounding the periphery of the current pass hole 401 on an inner surface thereof. When the container member 41 and the lid member 42 are combined, the inner frame portion 421 is fitted into inside of the outer frame portion 411, and a double cylinder is formed. The outer frame portion 411 and the inner frame portion 421 constitute an electrical shield between the transmission channel 30 such as the bus bar penetrating through the current pass hole 401 and the components mounted on the circuit board 50.

Incidentally, the inner frame portion 421 of the lid member 42 is a portion formed to be specially thin and tall among the projections formed in the insulating housing 40. Therefore, when the lid member 42 is molded by injection molding and then cooled down, the inner frame portion 421 is liable to be deformed into an obliquely inclined shape from its original shape.

When the inner frame portion 421 is deformed, a gap is generated between the inner frame portion 421 and the outer frame portion 411. Consequently, a sufficient creeping distance between the transmission channel 30 such as the bus bar penetrating through the current pass hole 401 and the electronic components mounted on the circuit board 50 is not secured, so that the probability of occurrence of a failure of the electronic components due to a surge voltage applied to the transmission channel 30 is increased.

Consequently, as illustrated in FIG. 3, a portion 4211 of the inner frame portion 421 of the lid member 42 on the root side with respect to a portion to be inserted into the outer frame portion 411 of the container member 41 is formed to be thicker than the portion to be inserted. Accordingly, the deformation of the inner frame portion 421 at the time of molding of the lid member 42 is reduced. Consequently, the sufficient creeping distance between the transmission channel 30 and the electronic components is secured, so that the probability of occurrence of the failure of the electronic components due to the surge voltage applied to the transmission channel 30 is reduced.

The container member 41 is a member configured to support and accommodate the magnetic core 10, the Hall element 20, the circuit board 50, and the connector 60 in a certain positional relationship. However, the connector 60 is accommodated in the insulating housing 40 in a state of being partly exposed. The container member 41 is formed with a void portion 412 which exposes the fourth side surface 614 of the connector 60.

More specifically, a core positioning portion 43, an element positioning portion 44, and a connector positioning portion 45 configured to support the magnetic core 10, the Hall element 20, and the body portion 61 of the connector 60 are formed respectively at predetermined positions inside the container member 41. Furthermore, a substrate fixing portion 46 to which the circuit board 50 is fixed at one point thereof is also formed inside the container member 41. A supporting structure of the respective components will be described.

The lid member 42 is assembled to the container member 41 which supports the magnetic core 10, the Hall element 20, the connector 60, and the circuit board 50 while holding the magnetic core 10 and the circuit board 50 tightly in-between in a state of closing the opening of the container member 41.

The container member 41 and the lid member 42 is provided with a lock mechanism 47 configured to hold the container member 41 and the lid member 42 in a combined state. The lock mechanism 47 illustrated in FIG. 1 includes a claw portion 471 formed so as to project from a side surface of the container member 41 and a ring-shaped frame portion 472 formed on the side of the lid member 42. With the claw portion 471 of the container member 41 fitted into a hole formed on the frame portion 472 of the lid member 42, the container member 41 and the lid member 42 are held in a state of being combined.

Referring now to FIG. 4 to FIG. 6, FIG. 10 to FIG. 12, a supporting structure of the magnetic core 10 in the insulating housing 40 will be described.

Figure 4:
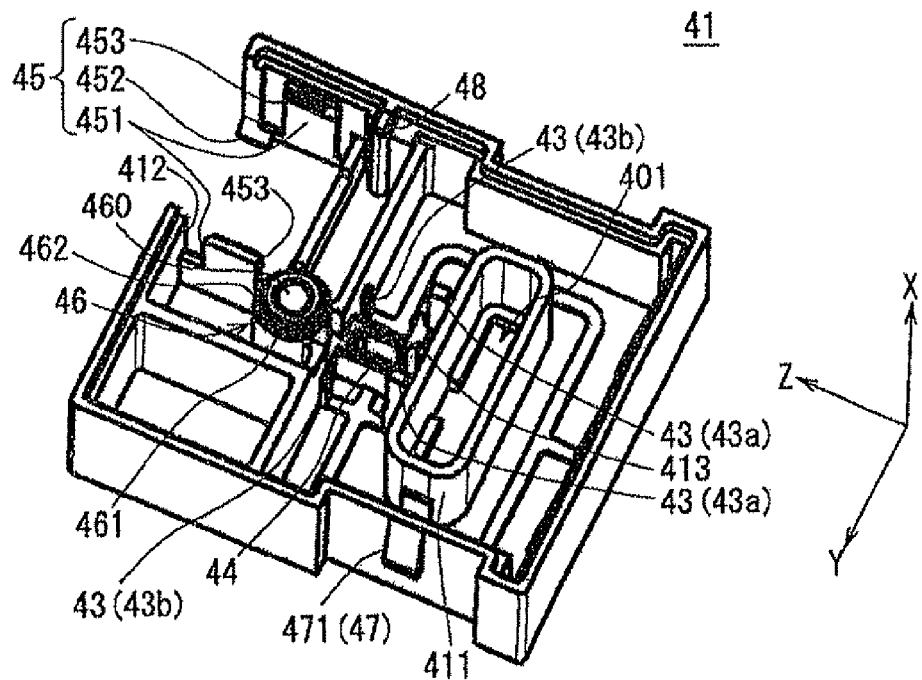
FIG. 4 is a perspective view of a container member which constitutes a housing of the current detecting apparatus 1.
Figure 5:
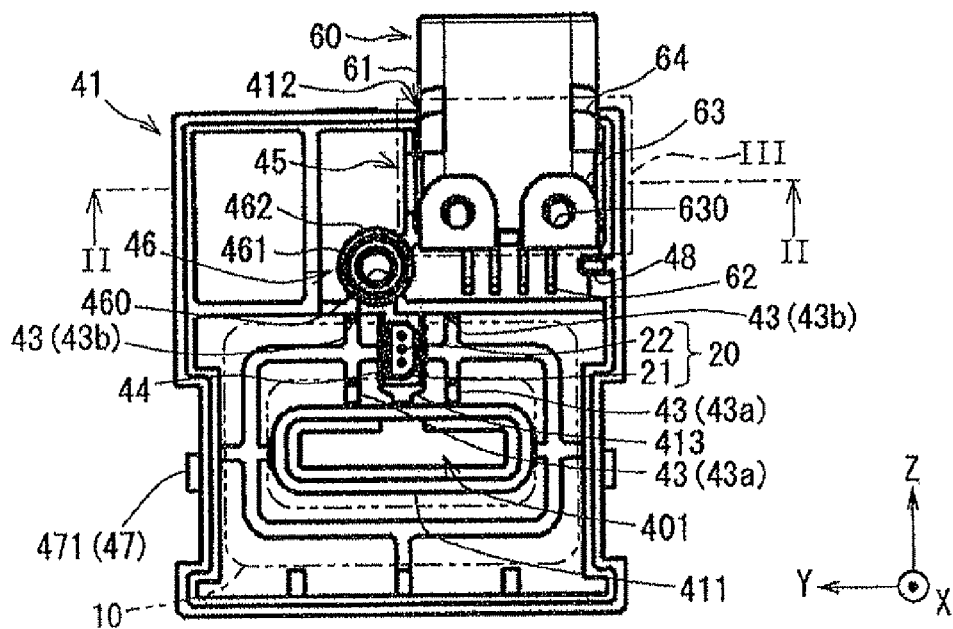
FIG. 5 is an internal view of the container member configured to support a Hall element and a connector.
Figure 6:
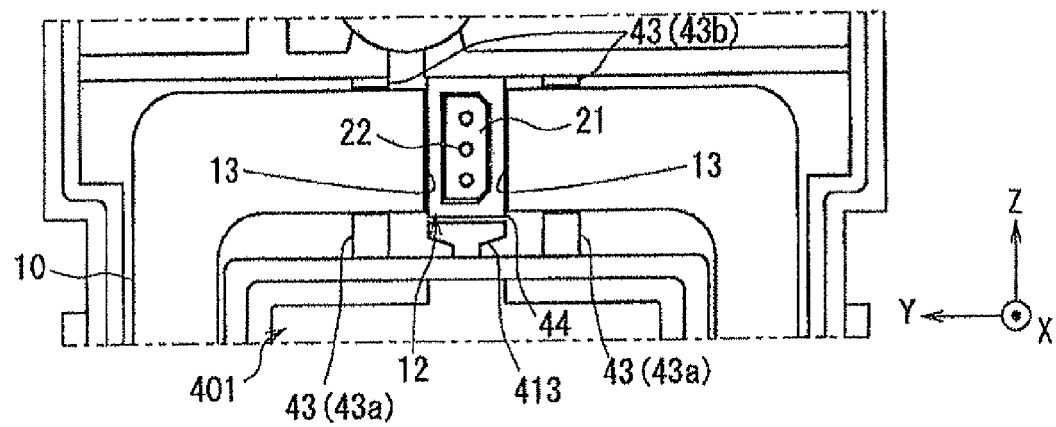
FIG. 6 is a front view of a portion configured to support a magnetic core in the container member.
Figure 10:
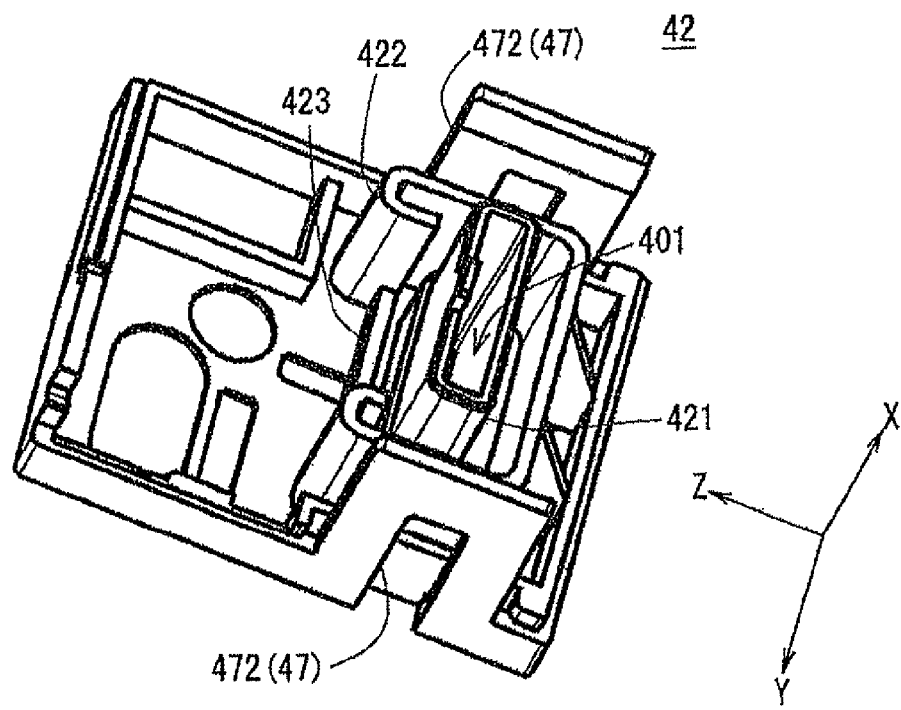
FIG. 10 is a perspective view of a lid member which constitutes the housing of the current detecting apparatus 1.
Figure 11:
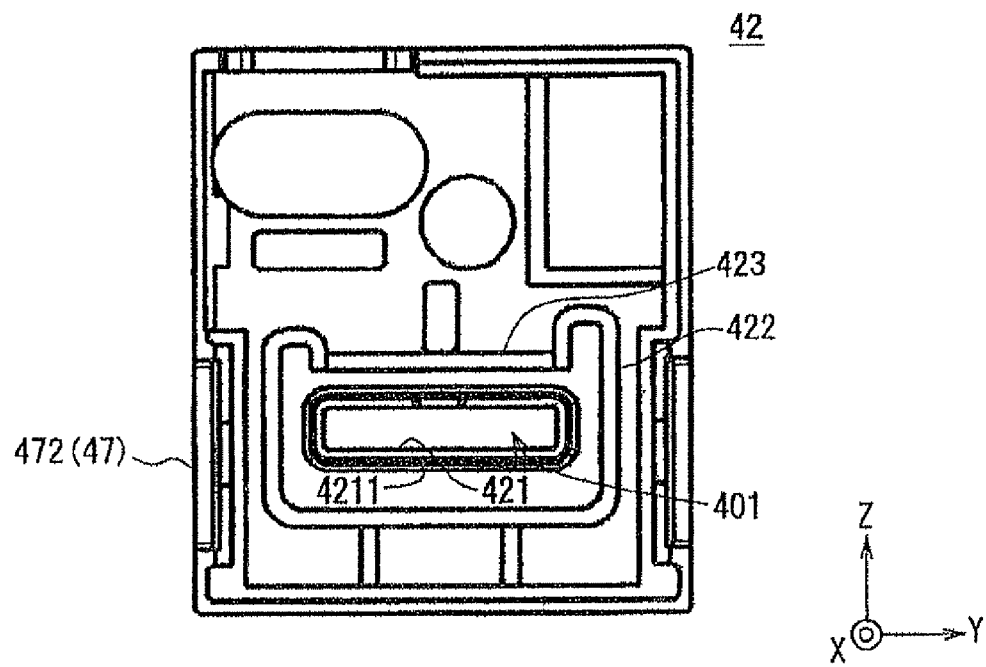
FIG. 11 is an internal view of the lid member which constitutes the housing of the current detecting apparatus 1.
Figure 12:
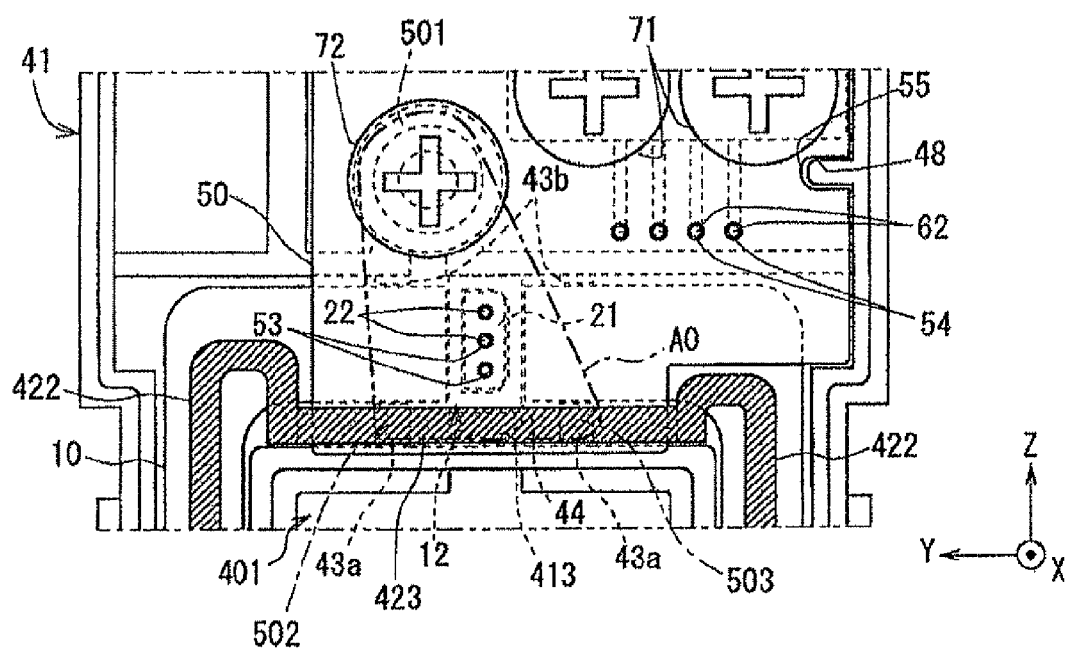
FIG. 12 is a front view of a portion that achieves positioning of the magnetic core and a circuit board in the current detecting apparatus 1.

FIG. 4 is a perspective view of the container member 41 which constitutes the insulating housing 40. FIG. 5 is an internal view of the container member 41 which supports the Hall element 20 and the connector 60. FIG. 6 is a front view of a portion configured to support the magnetic core 10 in the container member 41. FIG. 10 is a perspective view of the lid member 42 which constitutes the insulating housing 40. FIG. 11 is an internal view of the lid member 42. FIG. 12 is a front view of a portion that achieves positioning of the magnetic core 10 and the circuit board 50 in the current detecting apparatus 1. However, FIG. 12 is a front view viewed from a IV-IV plane illustrated in FIG. 2(a), and hence partly includes a cross-sectional view.

As illustrated from FIG. 4 to FIG. 6, core positioning portions 43 configured to support the magnetic core 10 are formed so as to project from the inner surface of the container member 41. The core positioning portions 43 include a plurality of projecting portions, and the plurality of projecting portions support the magnetic core 10 by holding part of the magnetic core 10 tightly therebetween. In FIG. 5, the magnetic core 10 is illustrated by an imaginary line (double-dashed chain line).

In the exemplary embodiments, as illustrated in FIG. 6, the four of the core positioning portions 43 support the magnetic core 10 by holding portions in the vicinity of the both end surfaces 13 of the magnetic core 10 tightly therebetween. Accordingly, the core positioning portions 43 restricts the movement of the magnetic core 10 in the third direction (Z-axis direction).

The four core positioning portions 43 include two core inner-edge positioning portions 43a and two core outer-edge positioning portions 43b. The two core inner-edge positioning portions 43a are formed in the container member 41 so as to project therefrom, and coming into contact with side portions of the gap portion 12 on an inner edge of the magnetic core 10 at side surfaces thereof. The two core outer-edge positioning portion 43b are formed in the container member 41 so as to project therefrom, and contact side portions of the gap portion 12 on an outer edge of the magnetic core 10 at the side surfaces thereof.

The two core inner-edge positioning portions 43a hold the position of the magnetic core 10 in the third direction (1-axis direction) by holding a portion in the vicinity of the both end surfaces 13 of the magnetic core 10 between the core inner-edge positioning portions 43a and the two core outer-edge positioning portions 43b.

The inner surface of the container member 41 is formed with the element positioning portion 44 so as to extend upright into the gap portion 12 of the magnetic core 10 supported by the core supporting portions 43. The element positioning portion 44 restricts the movement of the magnetic core 10 in the second direction (Y-axis direction) by being fitted into the gap portion 12 of the magnetic core 10.

In other words, the element positioning portion 44 comes into contact respectively with the both end surfaces 13 of the magnetic core 10, and holds the position of the Hall element 20 in the second direction. As described later, the element positioning portion 44 is a portion supporting the Hall element 20, and is also a portion restricting the movement of the magnetic core 10.

The magnetic core 10 illustrated in FIG. 6 is in a state in which positioning is achieved by the core positioning portions 43 and the element positioning portion 44 of the container member 41.

As illustrated in FIG. 10 and FIG. 11, a core holding portion 422 is formed so as to project from the inner surface of the lid member 42. The magnetic core 10 is held tightly between the inner surface of the container member 41 and the core holding portion 422 of the lid member 42, whereby the movement of the magnetic core 10 in the first direction (X-axis direction) is restricted.

As described thus far, positioning of the magnetic core 10 in directions of three dimensions is achieved by the core positioning portions 43, the element positioning portion 44, and the core holding portion 422 and the like, and the magnetic core 10 is held at a predetermined position in the insulating housing 40.

Referring now to FIG. 4 to FIG. 6, a supporting structure of the Hall element 20 in the insulating housing 40 will be described.

As illustrated in FIG. 4 to FIG. 6, the inner surface of the container member 41 is formed with the element positioning portion 44 so as to extend upright into the gap portion 12 of the magnetic core 10 supported by the core positioning portions 43. The element positioning portion 44 is formed with a depression (a space) at a position of the gap portion 12 of the magnetic core 10 so as to allow the magnetism detecting portion 21 of the Hall element 20 to be fitted therein. In exemplary embodiments, the element positioning portion 44 is formed into a wall shape surrounding a hollow portion (depression) to allow the magnetism detecting portion 21 to be fitted therein.

The element positioning portion 44 supports the magnetism detecting portion 21 of the Hall element 20 at a predetermined position by coming into contact with the magnetism detecting portion 21 of the Hall element 20 fitted into the depression formed therein from the periphery thereof. Accordingly, the Hall element 20 is held in a state in which the lead terminals 22 extend in parallel to the first direction (X-axis direction).

The element positioning portion 44 holds the position of the Hall element 20 mainly in the second direction and the third direction (Y-Z plane direction). The Hall element 20 is an extremely light-weight component. Therefore, the element positioning portion 44 is capable of maintaining the position of the Hall element 20 to some extent also in the first direction (X-axis direction) by a frictional resistance between the inner surface thereof and the magnetism detecting portion 21 of the Hall element 20.

In addition, the element positioning portion 44 comes into contact respectively with the both end surfaces 13 of the magnetic core 10 on the outer surface thereof, and holds the position of the magnetic core 10 in the second direction (Y-axis direction). As described above, the element positioning portion 44 has both the function to achieve the positioning of the magnetism detecting portion 21 of the Hall element 20 and the function to achieve the positioning of the magnetic core 10.

As described later, the circuit board 50 is fixed in the container member 41 in a state in which positioning of the magnetism detecting portion 21 of the Hall element 20 is achieved by the element positioning portion 44. At this time, the lead terminals 22 of the Hall element 20 are fitted into the Hall element mounting holes 53 of the circuit board 50. Then, the lead terminals 22 of the Hall element 20 are secured to the circuit board 50 by soldering. Therefore, the position of the Hall element 20 in the first direction (X-axis direction) is held by the fixed circuit board 50.

Figure 7:
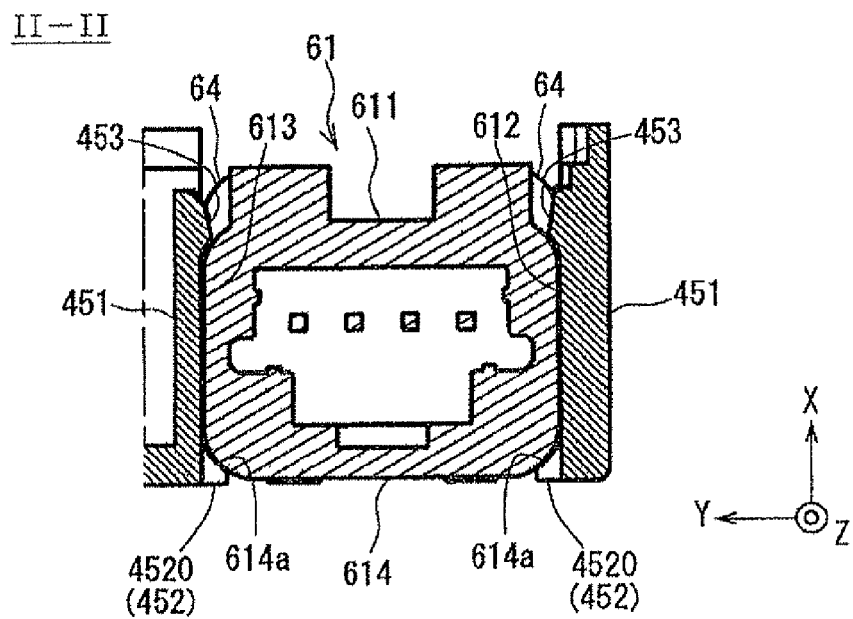
FIG. 7 is a lateral cross-sectional view of a connector positioning portion configured to support the connector.
Figure 8:
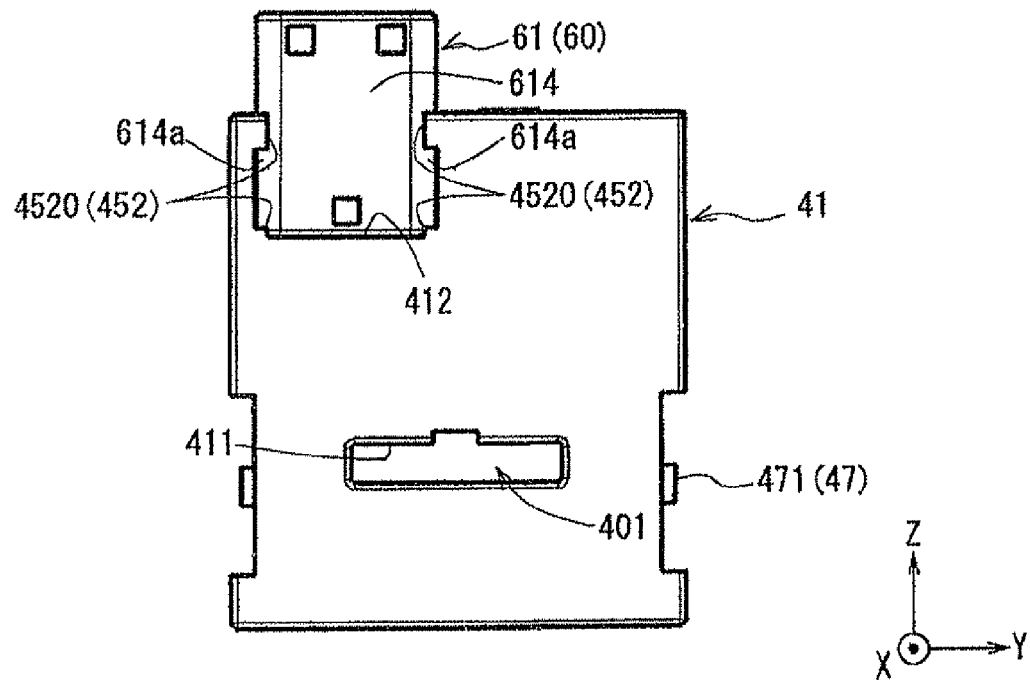
FIG. 8 is a back view of the container member configured to support the connector.
Figure 9:
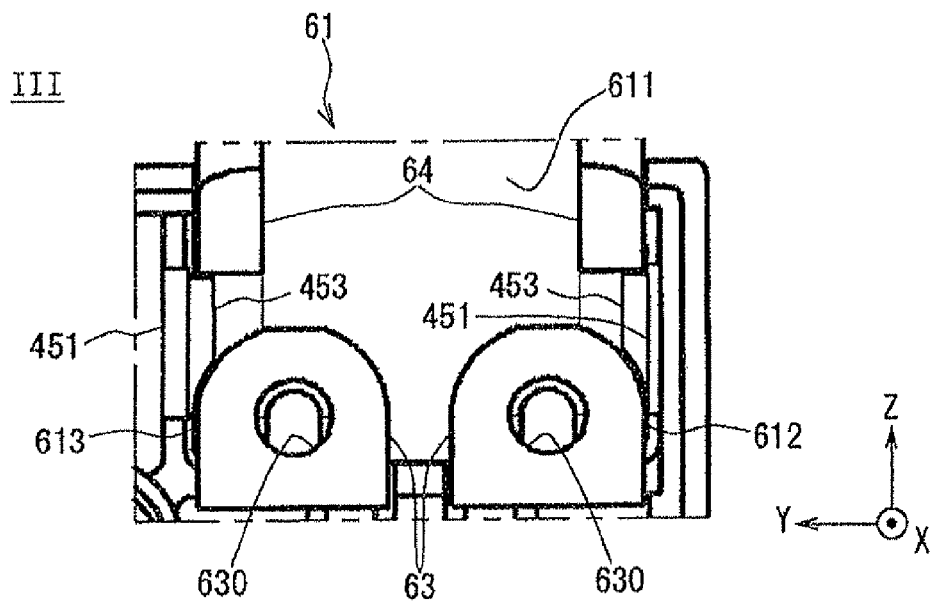
FIG. 9 is a front view of the connector positioning portion configured to support the connector.

Referring now to FIG. 4, FIG. 5, and FIG. 7 to FIG. 9, a supporting structure of the connector 60 in the insulating housing 40 will be described. FIG. 7 is a lateral cross-section of the connector positioning portion 45 configured to support the connector 60, and is a cross-sectional view taken along a II-II plane illustrated in FIG. 5. FIG. 8 is a back view of the container member 41 configured to support the connector 60. FIG. 9 is a front view of the connector positioning portion 45 configured to support the connector 60. FIG. 9 is an enlarged view of a portion surrounded by a frame border III in FIG. 5.

The connector positioning portion 45 is a portion configured to achieve positioning of the body portion 61 of the connector 60 by a fitting structure in three directions of the first direction (X-axis direction), the second direction (Y-axis direction), and the third direction (Z-axis direction) orthogonal to each other in a state in which the lead terminals 62 of the connector 60 extend in parallel to the first direction (X-axis direction). In other words, the connector positioning portion 45 holds the position of the connector 60 in directions of three dimensions.

More specifically, the connector positioning portion 45 includes a pair of first connector positioning portions 451, a second connector positioning portion 452, and third connector positioning portions 453.

The pair of first connector positioning portions 451 are portions formed into a plate shape so as to come into contact with the second side surface 612 and the third side surface 613 of the body portion 61 of the connector 60 as illustrated in FIG. 4, FIG. 5, and FIG. 7. The pair of first connector positioning portions 451 restrict the movement of the body portion 61 of the connector 60 in the second direction (Y-axis direction).

Also, the second connector positioning portion 452 is a portion configured to come into contact with the fourth side surface 614 of the body portion 61 of the connector 60 and configured to restrict the movement of the body portion 61 of the connector 60 toward the fourth side surface 614 in the first direction (the negative direction of the X-axis) as illustrated in FIG. 4, FIG. 7, and FIG. 8.

In exemplary embodiments, the second connector positioning portion 452 includes a plurality of protrusion portions 4520 formed so as to protrude from both sides of the fourth side surface 614 of the body portion 61 of the connector 60. In the example illustrated in FIG. 7 and FIG. 8, four of the protrusion portions 4520 are formed so as to protrude from the pair of first connector positioning portions 451, respectively. The four protrusion portions 4520 are formed at positions which form corners of a rectangle when viewed from the first direction.

The plurality of protrusion portions 4520 are formed so as to protrude in a state of coming into surface contact with chamfered portions 614a of the fourth side surface 614 of the body portion 61 of the connector 60 at edges on both sides which constitute boundary portions with respect to the second side surface 612 and the third side surface 613. Furthermore, the plurality of protrusion portions 4520 are each formed to be reduced gradually in thickness from a root portion which is in contact with an end of the fourth side surface 614 to a distal end portion thereof as illustrated in FIG. 7.

As illustrated in FIG. 8, a remaining portion of the fourth side surface 614 of the body portion 61 of the connector 60 other than portions where the plurality of protrusion portions 4520 come into contact with is entirely exposed from the container member 41 of the insulating housing 40.

The third connector positioning portions 453 are portions formed so as to protrude from both sides of the fourth side surface 614 of the body portion 61 of the connector 60 and enter between the screw seats 63 and the column portions 64 of the body portion 61 fitted between the pair of first connector positioning portions 451 as illustrated in FIG. 4 and FIG. 7. In exemplary embodiments, the pair of third connector positioning portions 453 are formed so as to protrude respectively from the pair of first connector positioning portions 451 and enter between the screw seats 63 and the column portions 64.

The third connector positioning portions 453 come into contact with respective side surfaces of the screw seats 63 and the column portions 64 arranged in a line in the third direction (Z-axis direction) as well as with the first side surface 611 of the body portion 61. Accordingly, the third connector positioning portions 453 restrict the movement of the body portion 61 toward the side where the screw seats 63 project in the first direction (the positive direction in the X-axis direction) and in the third direction (Z-axis direction).

Incidentally, portions of at least one of the pair of first connector positioning portions 451 where the third connector positioning portions 453 are formed are preferably formed into a cantilevered shape so as to have flexibility which allows displacement in the second direction (Y-axis direction). Accordingly, even when the third connector positioning portions 453 protrude from the pair of first connector positioning portions 451, the connector 60 may be fitted between the pair of first connector positioning portions 451 easily.

In exemplary embodiments, a portion of one of the first connector positioning portions 451 which comes into contact with the third side surface 613 of the connector 60 where the third connector positioning portion 453 is formed is formed into a cantilevered shape as illustrated in FIG. 4 and FIG. 7.

As described thus far, positioning of the body portion 61 of the connector 60 is achieved in directions of three dimensions by the connector positioning portion 45 including the first connector positioning portions 451, the second connector positioning portion 452, the third connector positioning portions 453, and is held at a predetermined position in the insulating housing 40.

Referring now to FIG. 1, FIG. 3, FIG. 4, FIGS. 10 to 12, a supporting structure of the circuit board 50 in the insulating housing 40 will be described.

The circuit board 50 is fixed to the substrate fixing portion 46 at one point thereof. As illustrated in FIG. 1 and FIG. 4, the substrate fixing portion 46 is a portion formed so as to project from the inner surface of the container member 41. Only one substrate fixing portion 46 is formed on the inner surface of the container member 41.

As illustrated in FIG. 4, a distal end portion 461 of the substrate fixing portion 46 is formed with a screw hole 460 which allows tightening of the second screw 72. In addition, the distal end portion 461 of the substrate fixing portion 46 is formed to have a size coming into tight contact with an inner surface of the second through hole 52 formed on the circuit board 50 while being fitted therein.

The distal end portion 461 of the substrate fixing portion 46 is formed to be thinner than a portion on the root side thereof by the intermediary of a shouldered portion 462. The length of the substrate fixing portion 46 from the shouldered portion 462 to a distal end is formed to be substantially the same as, or slightly shorter than, the thickness of the circuit board 50.

The circuit board 50 is assembled to the container member 41 in a state in which the magnetic core 10, the Hall element 20, and the connector 60 are supported respectively by the core positioning portions 43, the element positioning portion 44 and the connector positioning portion 45.

As illustrated in FIG. 1, an edge portion of the circuit board 50 is formed with a notched portion 55 for positioning. As illustrated in FIG. 4, a side wall of the container member 41 is formed with a guide rib 48 configured to fit into the notched portion 55 of the circuit board 50 on the inner surface thereof.

The circuit board 50 is assembled to the container member 41 in a direction in which the guide rib 48 of the container member 41 fits into the notched portion 55. Accordingly, the lead terminals 22 of the Hall element 20 fit into the Hall element mounting holes 53, the lead terminals 22 of the connector 60 fit into the connector mounting holes 54, and the distal end portion 461 of the substrate fixing portion 46 fits into the second through hole 52. Furthermore, the screw holes 630 formed in the two screw seats 63 of the connector 60 are aligned with the two first through holes 51 of the circuit board 50.

Then, the connector 60 is fixed to the circuit board 50 by the two first screws 71 screwed into the screw holes 630 of the screw seats 63 of the connector 60. Also, the circuit board 50 is held tightly between the shouldered portion 462 of the substrate fixing portion 46 and the head portion of the second screw 72 and is fixed to the substrate fixing portion 46 by the one second screw 72 screwed into the screw hole 460 of the substrate fixing portion 46.

Also, the guide rib 48 of the container member 41 fitted into the notched portion 55 of the circuit board 50 configured to restrict the circuit board 50 from being turned around together when the second screw 72 is screwed into the screw hole 460 of the substrate fixing portion 46. In other words, the guide rib 48 is an example of a substrate rotation restricting portion configured to restrict the circuit board 50 from rotating about a portion fixed to the substrate fixing portion 46 by coming into contact with the edge portion of the circuit board 50.

The lead terminals 22 of the Hall element 20 inserted into the Hall element mounting holes 53 and the lead terminals 22 of the connector 60 inserted into the connector mounting holes 54 are secured to the circuit board 50 by soldering.

When all the components are accommodated within the container member 41, the lid member 42 is combined with the container member 41, and the container member 41 and the lid member 42 are held in a state of being unified by the lock mechanism 47 as the insulating housing 40.

When the container member 41 and the lid member 42 are combined, at least two portions of the circuit board 50 are held tightly between a projecting portion on the inner surface of the container member 41 and a projecting portion on the inner surface of the lid member 42.

As described above, the four core positioning portions 43 are formed so as to project from the inner surface of the container member 41. The two core inner-edge positioning portions 43a from among the four core positioning portions 43 project so as to penetrate through the hollow portion 11 of the magnetic core 10. The top portions of the two core inner-edge positioning portions 43a come into contact with the surface on the side of the container member 41 (the first surface) of the circuit board 50 fixed to the substrate fixing portion 46.

In contrast, as illustrated in FIG. 10 to FIG. 12, a lid-side substrate holding portion 423 facing the two core inner-edge positioning portions 43a is formed so as to project from the inner surface of the lid member 42. In exemplary embodiments, the one lid-side substrate holding portion 423 is formed to have a width facing both of the two core inner-edge positioning portions 43a.

In FIG. 12, the core holding portion 422 and the lid-side substrate holding portion 423 are illustrated in cross sections.

When the lid member 42 is combined with the container member 41, the top portion of the lid-side substrate holding portion 423 comes into contact with the surface on the side of the lid member 42 (the second surface) of the circuit board 50. Accordingly, the circuit board 50 is held tightly between top surfaces of the two core inner-edge positioning portions 43a of the container member 41 and a top surface of the lid-side substrate holding portion 423 of the lid member 42.

In the description given below, a portion of the circuit board 50 fixed by the substrate fixing portion 46, that is, the edge portion of the second through hole 52 is referred to as a first portion 501. Portions of the circuit board 50 with which the respective top portions of the two core inner-edge positioning portions 43a come into contact are referred respectively to as a second portion 502 and a third portion 503.

As illustrated in FIG. 5, the substrate fixing portion 46 and the two core inner-edge positioning portions 43a are arranged at positions corresponding to apexes of a triangle surrounding a depression of the element positioning portion 44 when viewed from the first direction (X-axis direction).

Therefore, as illustrated in FIG. 12, the first portion 501, the second portion 502, and the third portion 503 of the circuit board 50 surround the portion where the lead terminals 22 of the Hall element 20 are mounted, that is, the portion of the Hall element mounting hole 53 from three sides. In other words, the portion of the circuit board 50 where the Hall element 20 is mounted is positioned within a substantially triangular surrounded area AO surrounded by the first portion 501, the second portion 502, and the third portion 503.

In contrast, the connector 60 is fixed to the outside of the area AO the circuit board 50. As described above, the connector 60 is electrically connected to the Hall element 20 via the lead terminals 62 and the wiring pattern of the circuit board 50.

In exemplary embodiments, an auxiliary substrate holding portion 413 configured to hold the circuit board 50 tightly with the lid-side substrate holding portion 423 of the lid member 42 is formed so as to project also between the two core inner-edge positioning portions 43a of the container member 41. The auxiliary substrate holding portion 413 serves to supplement a force of the two core inner-edge positioning portions 43a to hold the circuit board 50.

As described thus far, the circuit board 50 is fixed at the substrate fixing portion 46 with the second screw 72, and is restricted from being displaced by being held tightly from both of the front and back surfaces at positions of the two core inner-edge positioning portions 43a. Accordingly, the deflection (displacement) of the portion of the circuit board 50 where the Hall element 20 is mounted is reduced. Consequently, the positional displacement of the Hall element 20 due to the deflection of the circuit board 50 is inhibited.

In the current detecting apparatus 1, the circuit board 50 on which the Hall element 20 is mounted is fixed to the substrate fixing portion 46 of the insulating housing 40 in the first portion 501, and is held tightly between the core inner-edge positioning portions 43a of the container member 41 and the lid-side substrate holding portion 423 of the lid member 42 in the second portion 502 and the third portion 503.

Also, the first portion 501, the second portion 502, and the third portion 503 of the circuit board 50 are set to fall within a very small range in the periphery of the portion where the Hall element 20 is mounted. Therefore, the surrounded area AO surrounded by the three portions 501 to 503 of the circuit board 50 is hardly deflected.

Since the Hall element 20 is mounted in the surrounded area AO on the circuit board 50, the displacement of the Hall element 20 caused by the deflection (warp) of the circuit board 50 hardly occurs. Therefore, by the employment of the current detecting apparatus 1, deterioration of the current detection accuracy caused by the displacement of the positional relationship between the Hall element 20 and the magnetic core 10 mounted on the circuit board 50 may be reduced.

Since the connector 60 is fixed to the circuit board 50, in the current detecting apparatus 1 in which the circuit board 50 is susceptible to an external force via the connector 60, the effects of reducing deterioration of the current detection accuracy become more apparent.

In the current detecting apparatus 1, positioning of the connector 60 fixed to the circuit board 50 is achieved by the connector positioning portion 45 of the container member 41. Therefore, the external force applied to the connector 60 dispersedly acts on the connector positioning portion 45 and the circuit board 50, and the influence of the external force applied to the connector 60 on the positional displacement of the circuit board 50 and the Hall element 20 is alleviated. Consequently, the positional displacement of the Hall element 20 and the deterioration of the current detection accuracy caused by the external force applied to the connector 60 are reduced more reliably.

In the current detecting apparatus 1, the element positioning portion 44 configured to restrict the positional displacement of the magnetism detecting portion 21 of the Hall element 20 also has a function to restrict the positional displacement of the both end surfaces 13 of the magnetic core 10. In addition, the core inner-edge positioning portion 43a configured to restrict the positioning displacement of the magnetic core 10 toward the inner edge also serves as the container-side substrate holding portion which comes into contact with the circuit board 50 from the container member 41 side. Furthermore, the element positioning portion 44, the core outer-edge positioning portion 43b, and the core inner-edge positioning portion 43b which also serves as the container-side substrate holding portion exist intensively within the very small range around the Hall element 20.

In other words, in the current detecting apparatus 1, positioning of the magnetic core 10, the mounting portion of the Hall element 20 of the circuit board 50, and the magnetism detecting portion 21 of the Hall element 20 is achieved by a small number of positioning portions existing within the very small range in the insulating housing 40. Therefore, the Hall element 20 and the magnetic core 10 are not susceptible to the displacement of the positional relationship caused by dimension errors of the respective positioning portions in the insulating housing 40, so that the positioning with high degree of accuracy is achieved. Consequently, the possibility of deterioration of the current detection accuracy is reduced more reliably.

In the current detecting apparatus 1, the guide rib 48 restricts the circuit board 50 fixed at one point by the substrate fixing portion 46 from rotating. Consequently, the possibility of positional displacement of the Hall element 20 and the possibility of deterioration of the current detection accuracy caused by the rotation of the circuit board 50 are reduced. Since the circuit board 50 is fixed by the second screw 72 only at one point, the number of steps in the fixing work of the circuit board 50 is reduced in comparison with a case of being secured at a plurality of points with screws.

In the current detecting apparatus 1, the general-purpose connector 60 including the body portion 61 and the lead terminals 62 integrated into a unit is employed. Positioning of the magnetism detecting portion 21 of the Hall element 20 and the body portion 61 of the connector 60 is achieved by the container member 41 in a state in which the lead terminals 22 and 62 extend in parallel in the same direction (the first direction) by such a simple assembling process as to fit into part of the container member 41.

The container member 41 which is an integrally molded member formed of a resin material is formed with high degree of dimensional accuracy. Therefore, positioning of the lead terminals 22 of the Hall element 20 and the lead terminals 62 of the connector 60 is achieved with high degree of accuracy by the container member 41.

Therefore, even when the circuit board 50 is assembled to the container member 41 after the Hall element 20 and the connector 60 have assembled to the container member 41, the circuit board 50 is assembled to a correct position. Consequently, the possibility of the Hall element 20 mounted on the circuit board 50 moving from the correct position, and the possibility of useless stress being applied to the magnetism detecting portion 21 of the Hall element 20, are reduced. The possibility of deterioration of the current detection accuracy caused by these problems is also reduced.

Generally, in order that the circuit board 50 is firmly fixed to the container member 41, the circuit board 50 needs to be fixed to the container member 41 at least at two points. In contrast, in the current detecting apparatus 1, positioning of the connector 60 to be fixed to the circuit board 50 is achieved by the connector positioning portion 45 of the container member 41 in directions of three dimensions.

Therefore, the circuit board 50 is brought into a state of being substantially fixed to the container member 41 at two points of the substrate fixing portion 46 and the connector positioning portion 45 only by being fixed at one point by the second screw 72 and the substrate fixing portion 46. Consequently, the assembling process may be simplified in a state in which the strength of fixation of the circuit board 50 with respect to the container member 41 is sufficiently secured.

From the description given above, with the employment of the current detecting apparatus 1, the Hall element 20, the connector 60, and the circuit board 50 on which the Hall element 20 and the connector 60 are mounted may be fixed firmly with high degree of positional accuracy while employing the general-purpose connector 60 in the simple assembling process. Consequently, the mounting error of the components is reduced, and variations in detection accuracy of the current detecting apparatus 1 may be reduced.

The general-purpose connector configured to be fixable to the circuit board with the screw is generally formed with the two screw seats 63 and the two column portions 64, which are four projecting portions arranged at positions of corners of a rectangular in many cases in the same manner as the connector 60 of exemplary embodiments. With the employment of the current detecting apparatus 1, positioning of the connector 60 is achieved by the connector positioning portion 45 having a simple structure by using a plurality of the projecting portions provided on the general-purpose connector 60.

Also, the general-purpose connector is chamfered at boundary portions (corner portions) of the four side surfaces in many cases in the same manner as the connector 60 of exemplary embodiments. As illustrated in FIG. 7, the plurality of protrusion portions 4520 which constitute the second connector positioning portion 452 are formed to have a thickness which fills the chamfered portions 614a on the side surface of the connector 60. In this manner, by using the chamfered portions 614a on the side surface of the general-purpose connector 60, the dimension in the first direction (X-axis direction) of the container member 41 (the housing 40) may be reduced.

In the exemplary embodiments described above, the second connector positioning portion 452 is composed of the plurality of the protrusion portions 4520. However, it is also contemplated that the second connector positioning portion 452 corresponds to a plate-shaped portion coming into contact with an area of the fourth side surface 614 of the body portion 61 of the connector 60 from the second side surface 612 side to the third side surface 613 side. However, in this case, the dimension in the first direction (X-axis direction) of the insulating housing 40 is increased by an amount corresponding to the thickness of the plate-shaped second connector positioning portion 452.

It is also contemplated that the third connector positioning portions 453 are projecting portions which hold a side surface of at least one of the two screw seats 63 and the two column portions 64 of the connector 60 tightly therebetween.

It is contemplated that the circuit board 50 is fixed to the substrate fixing portion 46 with measures other than the screw. For example, the distal end portion 461 of the substrate fixing portion 46 penetrating through the second through hole 52 of the circuit board 50 is molded to have a shape larger than the second through hole 52 by a heater. Accordingly, the circuit board 50 is fixed by being held tightly between the shouldered portion 462 and a portion formed with a distal end of the substrate fixing portion 46. In this case, the distal end portion 461 on the distal side from the shouldered portion 462 of the substrate fixing portion 46 is formed to be longer than the thickness of the circuit board 50.

In the current detecting apparatus 1, the lid-side substrate holding portion 423 may be formed of two projections facing the two core inner-edge positioning portions 43*a*. In the current detecting apparatus 1, the one core inner-edge positioning portion 43*a* may be formed to have a width coming into contact with both of the second portion 502 and the third portion 503 which surround the mounting portion of the Hall element 20 from three sides in cooperation with the first portion 501 of the circuit board 50.

What is claimed is:

1. A current detecting apparatus comprising:
    a magnetic core formed of a magnetic material, having a first end, a second end, an inner edge, and an outer edge, the first end facing the second end and a gap portion being interposed between the first end and the second end, and the magnetic core being formed continuously so as to surround a periphery of a hollow portion of the magnetic core;
    a circuit board on which a magnetoelectric device configured to detect a magnetic flux in the gap portion of the magnetic core is mounted in an upright position, the circuit board including:
        a first portion,
        a second portion, and
        a third portion, the first portion, the second portion and the third portion of the circuit board forming a substantially triangular surrounded area and entirely surrounding the magnetoelectric device, the first portion, the second portion and the third portion of the circuit board each including:
            a first surface, and
            a second surface, the first surface opposite to the second surface, and
    a housing including:
        a container member;
        a lid member, the container member and the lid member having insulating properties and being assembled together, the housing being configured to accommodate the magnetic core and the circuit board and to support the magnetic core and the circuit board in a certain positional relationship,
        a substrate fixing portion formed in the container member outside the outer edge of the magnetic core supported by the container member, and to which the first portion of the circuit board is fixed,
        a container-side substrate holding portion formed in the container member so as to project therefrom, being disposed through the hollow portion of the magnetic core supported by the container member, and having a top portion coming into contact with the first surface of the second portion and the first surface of the third portion of the circuit board, and
        a lid-side substrate holding portion formed so as to project from the lid member, and having a top portion coming into contact at least with the second surface of the second portion and the third portion of the circuit board, and configured to, with the container-side substrate holding portion, hold the circuit board tightly.

2. The current detecting apparatus according to claim 1, wherein the housing includes:
    an element positioning portion formed in the container member so as to project therefrom, the element positioning portion having a space therein which allows fitting of a magnetism detecting portion of the magnetoelectric device at a position of the gap portion of the magnetic core, and coming into contact respectively to the first end and the second end of the magnetic core,
    a core outer-edge positioning portion formed in the container member so as to project therefrom, and coming into contact with side portions of the magnetic core near the gap portion, on the outer edge of the magnetic core, and
    a core inner-edge positioning portion formed in the container member so as to project therefrom, coming into contact with the side portions of the magnetic core near the gap portion, at the inner edge of the magnetic core, and, with the core outer-edge positioning portion, holding the magnetic core tightly, and
    the core inner-edge positioning portion also serves as the container-side substrate holding portion.

3. The current detecting apparatus according to claim 1, wherein the housing further includes a substrate rotation restricting portion formed on the container member and configured to restrict the rotation of the circuit board about the first portion, the substrate rotation restricting portion being in contact with an edge portion of the circuit board.

4. The current detecting apparatus according to claim 2, wherein the housing further includes a substrate rotation restricting portion formed on the container member and configured to restrict the rotation of the circuit board about the first portion, the substrate rotation restricting portion being in contact with an edge portion of the circuit board.

5. The current detecting apparatus according to claim 1, further comprising a connector fixed at a position outside an area surrounded by the first portion, the second portion, and the third portion of the circuit board, and electrically connected to the magnetoelectric device.

6. The current detecting apparatus according to claim 2, further comprising a connector fixed at a position outside an area surrounded by the first portion, the second portion, and the third portion of the circuit board, and electrically connected to the magnetoelectric device.

7. The current detecting apparatus according to claim 3, further comprising a connector fixed at a position outside an area surrounded by the first portion, the second portion, and the third portion of the circuit board, and electrically connected to the magnetoelectric device.

8. The current detecting apparatus according to claim 5, wherein the housing further includes a connector positioning portion formed on the container member and configured to hold a position of the connector in directions of three dimensions.

9. The current detecting apparatus according to claim 1, wherein the container member is an integrally molded member formed of a resin material.

* * * * *